(12) United States Patent
Glovatsky et al.

(10) Patent No.: US 6,391,211 B1
(45) Date of Patent: May 21, 2002

(54) METHOD FOR MAKING AN ELECTRICAL CIRCUIT BOARD

(75) Inventors: Andrew Z. Glovatsky, Plymouth; Robert Joseph Gordon, Livonia; Vivek Amir Jairazbhoy; Vladimir Stoica, both of Farmington Hills, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 2 days.

(21) Appl. No.: 09/655,559

(22) Filed: Sep. 6, 2000

(51) Int. Cl.[7] ............................. H01B 13/00; B44C 1/22
(52) U.S. Cl. ............................ 216/20; 216/13; 216/33; 216/34
(58) Field of Search ........................... 216/13, 14, 15, 216/16, 17, 18, 19, 20, 33, 34, 35, 36

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 5,536,362 A | * | 7/1996 | Love et al. .................... 216/13 |
| 5,688,408 A | * | 11/1997 | Tsuru et al. ................... 216/17 |
| 5,738,797 A | | 4/1998 | Belke, Jr. et al. |
| 5,741,430 A | * | 4/1998 | Dahringer et al. ............. 216/20 |
| 5,863,446 A | * | 1/1999 | Hanson ........................ 216/16 |
| 6,092,280 A | * | 7/2000 | Wojnarowski ............... 174/254 |

* cited by examiner

Primary Examiner—Randy Gulakowski
Assistant Examiner—Shamim Ahmed
(74) Attorney, Agent, or Firm—Visteon Global Technologies, Inc.

(57) ABSTRACT

A method for making multi-layer electronic circuit board including a pre-circuit assembly 12 and a ground layer 14 which are automatically aligned and bonded together by use of solder material or deposits 26, 28.

16 Claims, 2 Drawing Sheets

METHOD FOR MAKING AN ELECTRICAL CIRCUIT BOARD

FIELD OF THE INVENTION

The present invention relates to a method for making an electrical circuit board and more particularly, to a method for making a multi-layer electrical circuit board having multiple circuit interconnections and having apertures which are formed through the circuit board and/or through various portions of the circuit board.

BACKGROUND OF THE INVENTION

Multi-layer circuit boards contain and/or include electrical components which selectively and operatively populate opposed first and second surfaces (i.e., top and bottom surfaces) of each board (or other respective interior portions of each of the boards), thereby desirably allowing each of the electrical circuit boards to contain and/or include a relatively large number of electrical components which efficiently and densely populate the respective boards.

It is desirable to allow for communication by and between the component containing surfaces and/or portions of an electrical circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

This desired interconnection typically requires that one or more holes be drilled through each of the circuit boards, thereby creating at least one aperture or "via" lying and/or traversing between some or all of the opposed component containing surfaces, and through some or all of the various component containing interior circuit board portions. Such drilling is undesirable since it is relatively time consuming, costly, potentially causes damage to the formed electrical circuit boards requiring these circuit boards to be destroyed, and requires costly and inefficient electroless and/or electrolytic plating of the formed holes or "vias". Additionally, these types of drilling processes often require portions of the circuit board to be precisely aligned during assembly. This precise alignment is often difficult to achieve and thus, circuit layers or portions are often misaligned, thereby adversely effecting the overall function of the multi-layer circuit board.

There is therefore a need to provide a method for producing a multi-layer electrical circuit board which overcomes some or all of the previously delineated drawbacks and which selectively allows "vias" to be desirably and selectively formed without the use of drilling and plating procedures and which further allows for the interconnection of one or more layers of electrical circuitry.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which allows for the selective, efficient, and reliable formation of apertures and vias within the circuit board without the use of drilling and plating processes.

It is a third object of the present invention to provide a method for producing a multi-layer electrical circuit board which allows different layers of the circuit board to be automatically aligned during the circuit board formation process and which provides heatsinking and electrical interconnection pedestals to be integrally formed through the substrate.

According to a first aspect of the present invention a method for making a multi-layer electrical circuit board is provided. The method includes the steps of providing a first circuit portion having a first conductive surface; providing a second circuit portion having a second conductive surface; selectively applying first solder material to said first conductive surface; inserting said first circuit portion and said second circuit portion into a heated environment effective to cause said first solder material to be substantially liquefied; and moving said first circuit portion and said second circuit portion together in a manner which causes said first solder material to engage portions of said second conductive surface, thereby causing said first solder material to metallurgically bond to said portions of said first and second conductive surface, thereby automatically aligning said first circuit portion and said second circuit portion.

According to a second aspect of the present invention, a method for making a multi-layer circuit board is provided. The method includes the steps of: providing a first circuit layer having a first surface and a second surface; providing a second circuit layer having a third surface; selectively applying first solder material to the first surface; selectively applying first solder material to the second surface; heating the first circuit layer, effective to cause the first solder material to substantially liquefy; causing the first solder material to engage the third surface in a manner effective to cause the first solder material to metallurgically bond with the first and third surfaces, the bonding being effective to automatically align the first circuit layer with the second circuit layer in a desired manner; and selectively etching portions of the second surface of the first circuit layer, wherein at least a portion of the second solder material functions as an etchant mask and is effective to form at least one pedestal within the first circuit layer.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
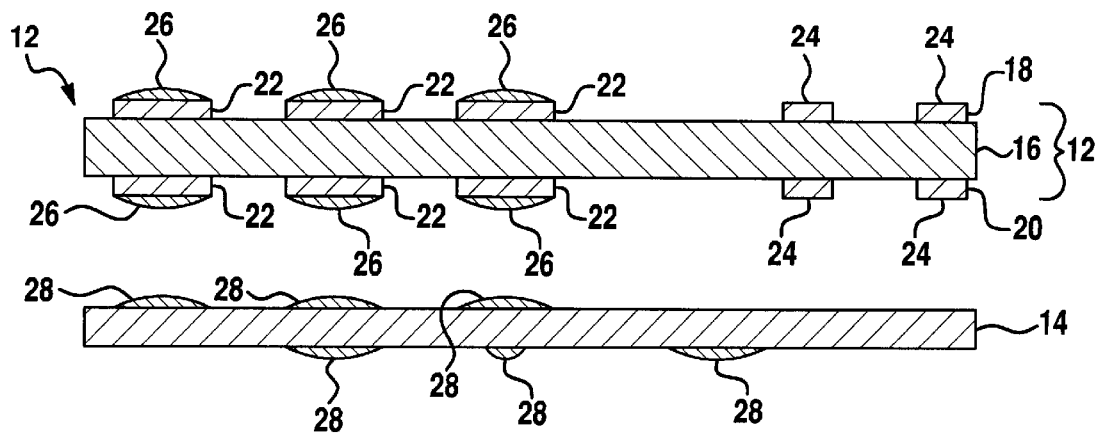
FIGS. 1(a)–(f) are successive sectional side views of a multi-layer circuit board being produced and/or formed in accordance with the teachings of the preferred embodiment of the invention.

Referring now to FIGS. 1(a)–(f), there is shown a method and/or a process for selectively forming a multi-layer electrical circuit board in accordance with the teachings of the preferred embodiment of the invention. Specifically, as shown best in FIG. 1(a), the circuit board formation or creation process begins with the acquisition and/or creation of a pre-circuit assembly 12 and a central or core member or ground layer 14. Pre-circuit assembly or tri-metal film 12 includes a core metal portion or signal routing layer 16, which is preferably manufactured and/or formed from a conventional aluminum material, and a pair of electrically conductive layers 18, 20 which are respectively attached to the opposing surfaces (e.g., top and bottom surfaces) of core metal portion 16 and which are preferably manufactured and/or formed from a conventional solderable material (e.g. copper). While copper and aluminum are used to form the preferred embodiment of the circuit board described herein, it should be appreciated that other metals and metal combinations can be used to form the circuit board and circuit board portions described herein, and may include metals such as iron, nickel, silver, gold, tin and alloys thereof. It should be understood that the terms "top" and "bottom", when used throughout this description, are used for illustrative purposes only and do not limit the scope or generality of the claimed invention. In the preferred embodiment of the invention, layers 16, 18 and 20 are selectively etched or milled according to predetermined designs, and then are metallurgically bonded together, as shown in FIG. 1(a). The design of members 18 and 20 allows for the selective formation of pass-through interconnects, heat sink pads, and electrically isolated vias. Particularly, members 18 and 20 are etched to create copper traces 22 on the aluminum core 16 and precursor sites 24 for pass-through interconnects.

In the preferred embodiment of the invention, core member 14 is electrically conductive and generally rectangular in shape. In one non-limiting embodiment, core member 14 comprises a copper strip or a metallic/electrically conductive foil.

In this first step of the process illustrated in FIG. 1(a), traces 22 are each coated with solder material 26 in a conventional manner, such as by a printing process, a solder paste application process, or an "HASL" coating process. In the preferred embodiment of the invention, solder material 28 is also applied to core member 14 in a conventional manner, such as by use of a printing process, a solder paste application process, or an "HASL" dip coating process. In such embodiments, a printed or photoimageable mask is applied to the ground layer 14 during the solder application process to shield the areas of core 14 which are not to be coated. In alternate embodiments, solder material is applied to only one of the surfaces which are to be joined (e.g., only to the "top" surface of layer 14 or only to the "bottom" surface of traces 22).

Figure 1B:
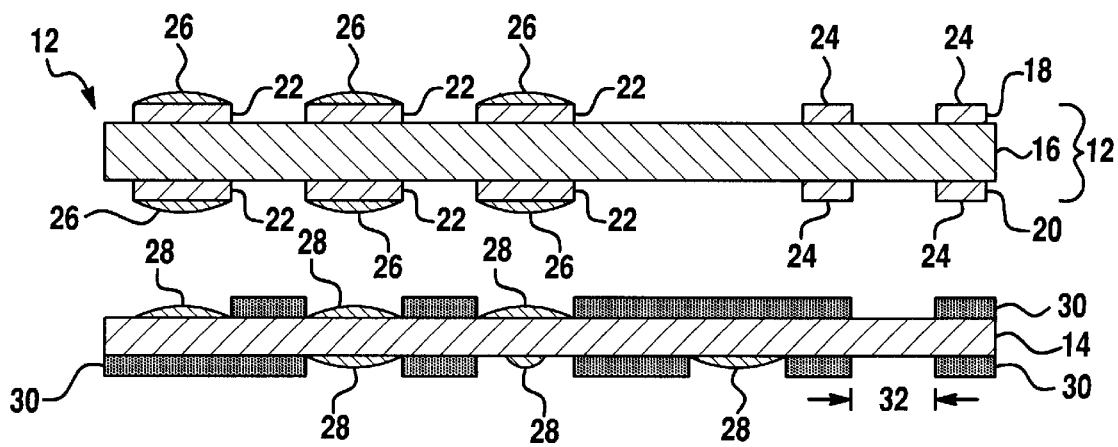

In the second step of the circuit board assembly process, as shown best in FIG. 1(b), a certain commercially available dielectric material 30 is. provided. Dielectric material 30 is selectively applied to the ground layer 14 in a conventional manner and is effective to electrically isolate the ground layer from the routing layer 16. Dielectric material 30 is selectively applied to exposed surfaces of core 14 (e.g., those not covered by solder material 28) with the exception of the surfaces within region 32 which are to form a via or aperture and any other surfaces which may be later etched or otherwise processed. In one non-limiting embodiment, dielectric material 30 has adhesive properties or comprises a conventional dielectric adhesive material.

Figure 1C:
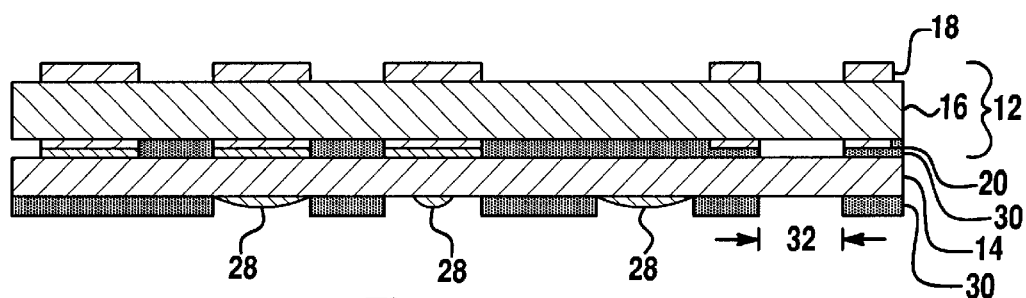

In the third step of the circuit board assembly process, best shown in FIG. 1(c), pre-circuit assembly 12 is aligned with and bonded to ground layer 14. In the preferred embodiment of the invention, this step is performed at an elevated temperature or at a temperature that causes the solder material 26, 28 to substantially liquefy and bond to the metal surfaces of layers 18, 20 and core 14, thereby coupling pre-circuit assembly 12 to core 14. Pre-circuit assembly 12 and core 14 are preferably inserted into a controlled heated environment, such as a conventional convection oven, a belt oven or a heated platen press. During this third step, pre-circuit assembly 12 and core 14 are brought or moved in close proximity to one another, effective to cause the solder deposits 26, 28 to engage and/or contact the "wettable" and/or metallugically bondable surfaces of layer 14 and traces 22. The surface tension properties of the engaged solder material 26, 28 cooperate to allow the pre-circuit assembly 12 and core 14 to "float" relative to each other and the bonding of the solder material to the respective "wettable" surfaces cause core 14 to automatically align with pre-circuit assembly 12 after reaching an equilibrium. This "self-alignment" is controlled by the shape and amount of solder deposits, pads or sites 26, 28 that are used, the amount of solder used for each deposit, pad or site 26, 28, and the shape and amount of the "wettable" surfaces on layers 12 and 14. Hence, the parameters can be altered to achieve additional or different alignments between pre-circuit assembly 12 and core 14. Solder material 26, 28 also provides electrical connections between core 14 and traces 22. In one non-limiting embodiment, a conventional lamination or curing process is also performed on the circuit board assembly (e.g., when an adhesive dielectric is used) after metallurgical bonding has taken place to further mechanically secure pre-circuit assembly 12 and core 14 together. In other alternate embodiments, the curing process and the metallurgical bonding process is performed substantially concurrently.

Figure 1D:
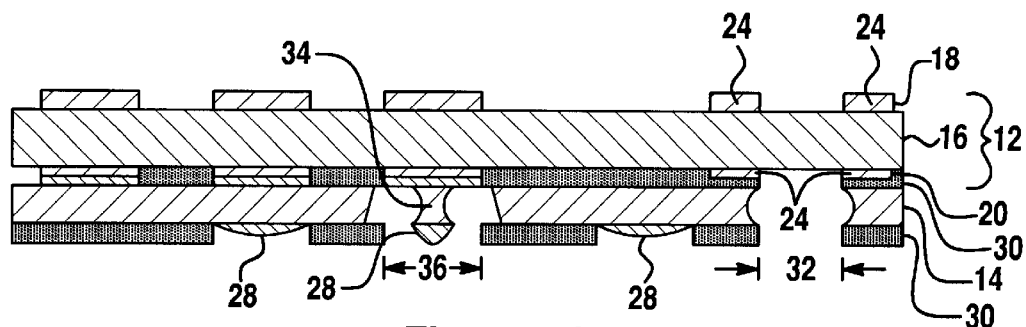

In the fourth step of the circuit board assembly process, as shown best in FIG. 1(d), exposed portions on the bottom surface of core 14 are selectively removed by use of a conventional etching process. In this step, various structures may be formed within core 14, such as electrical "pass-throughs", isolated "pass-throughs", vias, apertures and/or "heat sinks". For example and without limitation., an electrical pass-through or pedestal portion 34 is formed within core member 14 by selectively etching within area or region 36. Importantly, in this step of the process, solder mask material 28 in region 36 acts as a an etchant mask, thereby allowing the etching of region 36 to form pedestal 34. It should be appreciated that the location of the solder deposit 28 within area 36 and the "etchant mask" function of material 28 allows the pass-through member or pedestal 34 to be relatively easily formed by applying a chemical etchant material (e.g., a copper etchant) to area 36. It should be appreciated that a heat sink may be selectively formed in a similar manner as pass-through 34 by increasing the size of portion 34 (e.g., forming portion 34 with a larger size or diameter). It should also be appreciated that portion 34 can act as a trace, either isolated or coupled to the rest of core 14, and can be used to interconnect other traces on laminated layers as needed. A second exposed area or region 32 is also selectively etched from the bottom side or surface of core 14 in order to form a via or aperture 38 within the core 14, as explained more fully and completely below.

Figure 1E:
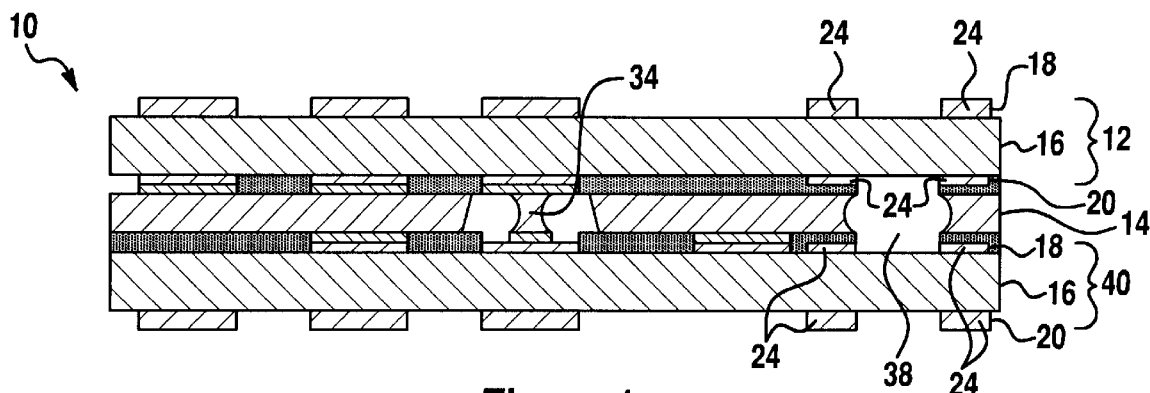

In the fifth step of the circuit board assembly process, as shown best in FIG. 1(e), a second pre-circuit assembly 40 is provided which is substantially identical to pre-circuit assembly 12, and is selectively attached to the bottom of core 14. In the preferred embodiment, pre-circuit assembly 40 is aligned with and bonded to core 14 in a manner substantially identical to the previously described third step of the process (e.g., solder material is selectively applied to pre-circuit assembly 40 and cooperates with solder material 28 to electrically and mechanically bond and align pre-circuit assembly 40 and ground layer 14). In alternate embodiments, pre-circuit assembly 40 is attached to ground layer 14 by use of a conventional lamination process.

Figure 1F:
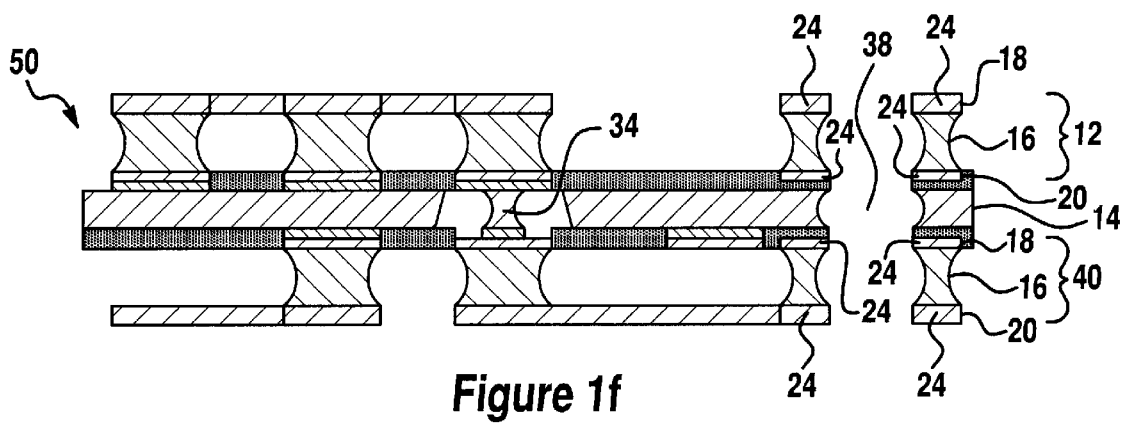

In the sixth step of the circuit board assembly process, as shown best in FIG. 1(f), a certain etchant material (i.e., an aluminum etchant) is applied to certain portions of core metal members 16 which remain exposed (i.e., those portions of core metal members 16 which were not respectively covered by electrically conductive portions 18, 20), effective to selectively remove or "etch away" certain selective portions of metal core members 16. The selective etching of core metal members 16 allows for the formation of a through hole type via or aperture 38, in which various circuit board portions, devices, connectors and/or connector assemblies may be placed, secured and/or interconnected in a desired fashion, such as by a conventional soldering process. Particularly, the portions of core metal members 16 that are etched away communicate and/or cooperate with the portion of ground layer 14 that was etched away to form throughhole, via or aperture 38. Aperture 38 allows layers 18, 20 and 14 to be selectively interconnected by way of precursor sites or portions 24.

It should be appreciated that the resulting or formed circuit board assembly 50 may be further processed in a manner which allows for the selective formation and/or application of additional vias or apertures, traces and other desired circuit connection strategies and/or component connection strategies.

It should be further realized that the foregoing circuit board assembly process and the resulting circuit board 50 provide for the formation of vias, apertures, electrical and isolated pass-throughs and heat sinks, without requiring the circuit board to be drilled or exposed to other mechanical types of removal and formation processes which may damage the circuit board. Additionally, the foregoing circuit board formation process and the automatic alignment provided by the process substantially ensure proper alignment between circuit board portions 12, 14 and 40 and thereby substantially prevent the occurrence of defects or other issues which arise from the misalignment of layers in a multi-layer circuit board.

It should be understood that the invention is not limited to the exact embodiment or construction which has been illustrated and described but that various changes may be made without departing from the spirit and the scope of the invention.

What is claimed is:

1. A method for making a multi-layer circuit board assembly comprising the steps of:
    providing a first circuit portion having a first conductive surface wherein the first circuit portion comprises a core metal member;
    providing a second circuit portion having a second conductive surface;
    selectively applying first solder material to said first conductive surface;
    inserting said first circuit portion and said second circuit portion into a heated environment effective to cause said first solder material to be substantially liquefied; and
    moving said first circuit portion and said second circuit portion together in a manner which causes said first solder material to engage portions of said second conductive surface, thereby causing said first solder material to metallurgically bond to said portions of said first and second conductive surfaces, thereby automatically aligning said first circuit portion and said second circuit portion and selectively applying an etch resistant material to portions of said core metal member; and
    selectively forming at least one first aperture within said core metal member by an etching process; selectively forming a pass through member within said core metal member, wherein the pass through member is formed by use of an etching process and wherein a portion of said first solder material functions as an etchant mask during said etching process, thereby forming said pass through member.

2. The method of claim 1 wherein said second circuit portion comprises a pre-circuit assembly including core member having a top and bottom surface and first and second conductive members which are respectively attached to said top and bottom surfaces.

3. The method of claim 1 wherein second solder material is selectively applied to said second conductive surface and is effective to engage said first solder material and bond with said first and second conductive surfaces, thereby assisting in the automatic alignment between said first circuit portion and said second circuit portion.

4. The method of claim 1 further comprising the step of:
    selectively forming at least one second aperture within said second circuit portion which cooperates with said at least one first aperture to form at least one via through said circuit board.

5. A method for making a circuit board comprising the steps of:
    providing a first pre-circuit assembly including a core member having a first and second surface and first and second conductive members which are respectively attached to said first and second surface;
    providing a ground layer having a third and fourth surface;
    selectively applying a first solder material to said first surface of said first conductive member;
    selectively applying a second solder material to said third surface of said ground layer;
    selectively applying a certain dielectric material to selective portions of said third and fourth surfaces of said core member;
    inserting said first pre-circuit assembly and said ground layer in a heated environment, effective to cause said first and second solder material to substantially liquefy; and
    moving said first pre-circuit assembly in relative close proximity to said ground layer such that said first solder material engages said second solder material, said engagement being effective to cause said first pre-circuit assembly and ground layer to be automatically aligned and metallurgically bonded together.

6. The method for making the circuit board assembly of claim 5 further comprising the steps of:
    selectively etching said first and second conductive members prior to attaching said first and second conductive members to said core member.

7. The method for making the circuit board assembly of claim 6 wherein said selective etching of said first and second conductive members is effective to form trace portions in said first and second conductive members, and wherein said first solder material is selectively applied to said trace portions.

8. The method for making a circuit board assembly of claim 5 wherein said first and second conductive members and said ground layer are each formed from a copper material.

9. The method for making a circuit board assembly of claim 8 wherein said core member is formed from an aluminum material.

10. The method for making a circuit board assembly of claim 5 further comprising the step of:

selectively etching said ground layer effective to form at least one pass through member within said ground layer.

11. The method for making a circuit board assembly of claim 5 further comprising the step of:

selectively etching said ground layer effective to form at least one aperture through said ground layer.

12. A method for making a multi-layer circuit board comprising the steps of:

providing a first circuit layer having a first surface and a second surface;

providing a second circuit layer having a third surface;

selectively applying first solder material to said first surface;

selectively applying first solder material to said second surface;

heating said first circuit layer, effective to cause said first solder material to substantially liquefy;

causing said first solder material to engage said third surface in a manner effective to cause said first solder material to metallurgically bond with said first and third surfaces, said bonding being effective to automatically align said first circuit layer with said second circuit layer in a desired manner; and selectively etching portions of said second surface of said first circuit layer, wherein at least a portion of said second solder material functions as an etchant mask and is effective to form at least one pedestal within said first circuit layer.

13. The method of claim 11 further comprising the steps of:

providing a third circuit layer having a fourth surface;

heating said first circuit layer, effective to cause said second solder material to substantially liquefy; and causing said second solder material to engage said fourth surface in a manner effective to cause said second solder material to metallurgically bond with said fourth surface, said bonding being effective to automatically align said first circuit layer with said third circuit layer in a desired manner.

14. The method of claim 12 further comprising the step of:

selectively applying dielectric material to said first and second surfaces prior to bonding said first circuit layer to said second circuit layer.

15. The method of claim 11 wherein said second circuit layer comprises conductive trace portions which are engaged by said first solder material.

16. The method of claim 15 further comprising the step of applying third solder material to said conductive trace portions, said third solder material being effective to cooperate with said first solder material to bond and align said first and second circuit layers.

* * * * *